(12) United States Patent
Kurokawa et al.

(10) Patent No.: US 9,703,423 B2
(45) Date of Patent: Jul. 11, 2017

(54) ELECTRONIC DEVICE AND ELECTRONIC SYSTEM

(75) Inventors: Yoshiyuki Kurokawa, Kanagawa (JP);
Takayuki Ikeda, Kanagawa (JP);
Hikaru Tamura, Kanagawa (JP);
Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 487 days.

(21) Appl. No.: 13/006,702

(22) Filed: Jan. 14, 2011

(65) Prior Publication Data
US 2011/0175833 A1 Jul. 21, 2011

(30) Foreign Application Priority Data
Jan. 20, 2010 (JP) ................................. 2010-010391

(51) Int. Cl.
*G09G 3/04* (2006.01)
*G06F 3/042* (2006.01)
*H01L 27/146* (2006.01)

(52) U.S. Cl.
CPC ........ *G06F 3/042* (2013.01); *H01L 27/14609* (2013.01); *H01L 27/14643* (2013.01); *H01L 27/14692* (2013.01)

(58) Field of Classification Search
CPC .. G09G 3/36; G09G 5/00; G06F 3/041; G06F 3/042; H01L 27/14692; H01L 27/14643
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1 122 792 A2 | 8/2001 |
| EP | 1280129 A | 1/2003 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

(Continued)

*Primary Examiner* — Andrew Sasinowski
*Assistant Examiner* — Chun-Nan Lin
(74) *Attorney, Agent, or Firm* — Fish & Richardson P.C.

(57) ABSTRACT

One object is to provide a new electronic device which is configured so that a user can read data regardless of a location, input data by directly touching a keyboard displayed on a screen or indirectly touching the keyboard with a stylus pen or the like, and use the input data. A first transistor electrically connected to a reflective electrode and a photo sensor are included over one substrate. A touch-input button displayed on a first screen region of the display portion is displayed as a still image, and a video signal is output so that a moving image is displayed on a second screen region of the display portion. A video signal processing portion supplying different signals between the case where a still image is displayed on the display portion and the case where a moving image is displayed on the display portion is included.

23 Claims, 10 Drawing Sheets

(58) Field of Classification Search
USPC ..... 345/173, 175, 204, 87, 102, 660; 257/82
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,674,470 B1 | 1/2004 | Tanaka et al. |
| 6,727,522 B1 | 4/2004 | Kawasaki et al. |
| 6,747,638 B2 | 6/2004 | Yamazaki et al. |
| 6,867,811 B2 | 3/2005 | Nakamura et al. |
| 6,879,344 B1 | 4/2005 | Nakamura et al. |
| 6,888,571 B1 | 5/2005 | Koshizuka et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,113,213 B2 | 9/2006 | Matsunaga et al. |
| 7,123,243 B2 | 10/2006 | Kawasaki et al. |
| 7,123,246 B2 | 10/2006 | Nakatani et al. |
| 7,158,129 B2 | 1/2007 | Nakajima |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,433,179 B2 | 10/2008 | Hisano et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,522,149 B2 | 4/2009 | Nakamura et al. |
| 7,525,523 B2 | 4/2009 | Yamazaki et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,800,594 B2 | 9/2010 | Nakamura et al. |
| 7,872,320 B2 | 1/2011 | Tsuchiya et al. |
| 8,089,476 B2 | 1/2012 | Ishiguro et al. |
| 8,179,386 B2 | 5/2012 | Katoh et al. |
| 8,330,747 B2 | 12/2012 | Nakanishi et al. |
| 8,350,835 B2 | 1/2013 | Katoh et al. |
| 8,456,459 B2 | 6/2013 | Yamazaki et al. |
| 8,514,165 B2 | 8/2013 | Yoshida |
| 8,803,781 B2 | 8/2014 | Kimura et al. |
| 8,830,217 B2 | 9/2014 | Yamazaki et al. |
| 9,261,998 B2 * | 2/2016 | Kurokawa ............ G06F 3/0412 |
| 2001/0046027 A1 | 11/2001 | Tai et al. |
| 2002/0011972 A1 * | 1/2002 | Yamazaki ......... H01L 27/14678 345/74.1 |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0132474 A1 * | 6/2006 | Lam ....................... G09G 3/20 345/204 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0221067 A1 * | 10/2006 | Kim et al. .................... 345/204 |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0180385 A1 * | 7/2008 | Yoshida et al. .............. 345/102 |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0040174 A1 | 2/2009 | Yamashita |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141004 A1 * | 6/2009 | Yamazaki .................... 345/175 |
| 2009/0141046 A1 | 6/2009 | Rathnam et al. |
| 2009/0143109 A1 * | 6/2009 | Yamazaki ............ G06F 1/1626 455/566 |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0189849 A1 * | 7/2009 | Miyazaki ............... G09G 3/344 345/107 |
| 2009/0207194 A1 | 8/2009 | Wang et al. |
| 2009/0278122 A1 | 11/2009 | Hosono et al. |
| 2009/0280600 A1 | 11/2009 | Hosono et al. |
| 2009/0289910 A1 * | 11/2009 | Hattori ............... G02F 1/13338 345/173 |
| 2009/0303170 A1 * | 12/2009 | Chung et al. ................. 345/102 |
| 2010/0026722 A1 * | 2/2010 | Kondo ................. G09G 3/2007 345/660 |
| 2010/0065844 A1 | 3/2010 | Tokunaga |
| 2010/0085331 A1 | 4/2010 | Kurokawa et al. |
| 2010/0092800 A1 | 4/2010 | Itagaki et al. |
| 2010/0109002 A1 | 5/2010 | Itagaki et al. |
| 2010/0141772 A1 * | 6/2010 | Inaguma ............... G01S 3/7864 348/169 |
| 2010/0149138 A1 * | 6/2010 | Lee ...................... G09G 3/3648 345/204 |
| 2010/0182282 A1 * | 7/2010 | Kurokawa ........... G02F 1/13338 345/175 |
| 2010/0231493 A1 * | 9/2010 | Kaise et al. .................... 345/87 |
| 2010/0308345 A1 * | 12/2010 | Brown et al. .................... 257/82 |
| 2011/0122098 A1 | 5/2011 | Kurokawa |
| 2011/0122108 A1 | 5/2011 | Kozuma et al. |

(56) References Cited

U.S. PATENT DOCUMENTS

| | | | |
|---|---|---|---|
| 2011/0176652 A1* | 7/2011 | Kurokawa | H03K 23/548 377/49 |
| 2012/0013595 A1 | 1/2012 | Murai et al. | |
| 2012/0013650 A1 | 1/2012 | Mizubuchi | |
| 2014/0334596 A1 | 11/2014 | Kimura et al. | |

FOREIGN PATENT DOCUMENTS

| | | |
|---|---|---|
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2000331557 A | 11/2000 |
| JP | 2001-036087 A | 2/2001 |
| JP | 2001-117115 A | 4/2001 |
| JP | 2001-292276 A | 10/2001 |
| JP | 2002-076356 A | 3/2002 |
| JP | 2002-169499 A | 6/2002 |
| JP | 2002-289859 A | 10/2002 |
| JP | 2003-044011 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-341813 A | 12/2004 |
| JP | 2005-077822 A | 3/2005 |
| JP | 2005077822 A | 3/2005 |
| JP | 2005-122450 A | 5/2005 |
| JP | 2006-053678 A | 2/2006 |
| JP | 2006-165529 A | 6/2006 |
| JP | 2006-267982 A | 10/2006 |
| JP | 2006-330578 A | 12/2006 |
| JP | 2009-004757 A | 1/2009 |
| JP | 2009-300591 A | 12/2009 |
| KR | 2008-0063198 A | 7/2008 |
| TW | 544929 | 8/2003 |
| WO | 2004/114391 A1 | 12/2004 |
| WO | 2006/051993 A2 | 5/2006 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO

(56) References Cited

OTHER PUBLICATIONS

Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5). InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, March, 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors." Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED." AM-FPD '08 Digest of Technical Papers, Jul. 2, 2008, pp. 275-278.

Park. S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

(56) References Cited

OTHER PUBLICATIONS

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
PCT Invitation to Pay Additional Fees (International Application No. PCT/JP2010/073889) mailed Feb. 1, 2011.
Taiwanese Office Action (Application No. 100101097) Dated Jun. 29, 2015.
Korean Office Action (Application No. 2012-7020864) Dated Mar. 16, 2017.

* cited by examiner

ELECTRONIC DEVICE AND ELECTRONIC SYSTEM

TECHNICAL FIELD

The present invention relates to an electronic device having a circuit including a transistor, and also relates to an electronic system. For example, the present invention relates to an electronic device on which an electro-optical device typified by a liquid crystal display panel is mounted as a component.

BACKGROUND ART

In recent years, display devices such as electronic book readers have been actively developed. In particular, since a technique in which an image is displayed with the use of a display element having memory properties greatly contributes to reduction of power consumption, the technique has been actively developed (Patent Document 1).

In addition, a display device provided with a touch sensor has attracted attention. The display device provided with a touch sensor is called a touch panel, a touch screen, or the like (hereinafter also referred to simply as a touch panel). Further, a display device on which an optical touch sensor is mounted is disclosed in Patent Document 2.

REFERENCE

Patent Documents

[Patent Document 1] Japanese Published Patent Application No. 2006-267982
[Patent Document 2] Japanese Published Patent Application No. 2001-292276

DISCLOSURE OF INVENTION

One object of an embodiment is to provide a new electronic device which is configured so that a user can read data regardless of a location, input data by directly touching a keyboard displayed on a screen or indirectly touching the keyboard with a stylus pen or the like, and use the input data. An object of an embodiment is to provide a pixel structure in which a light-receiving area of photo sensors and a pixel electrode area per unit area are increased in order to obtain an electronic device configured so that a user can read data and input data by touching a keyboard displayed on a screen.

In addition, an object of an embodiment is to provide a new electronic device in which a still-image mode including display of a keyboard and a moving-image mode are realized on one screen.

In addition, one object of an embodiment is to reduce power consumption in such a manner that, in the case of the still-image mode, a still image is displayed on part of a display portion, then supply of power to display elements in a region where the still image is displayed is stopped, and a state in which the still image can be seen is kept for a long time after the stop of supply.

Further, an object of an embodiment is to establish an electronic system which is advantageous for energy saving of an electronic device whose power is limited, such as a portable information terminal.

In an electronic device including a display portion in which an image is displayed using external light, the display portion has a touch-input function with the use of photo sensors, keyboard buttons are displayed on at least part of the display portion, and a user inputs data by touching a desired key, so that display corresponds to the desired key is performed on the display portion.

The photo sensors detect external light entering the display portion and a shadow which is made on part of the display portion (hereinafter, also referred to as a partial shadow of external light) when a user points a desired position on the display device. An input processing portion processes the position of a photo sensor which detects the partial shadow of external light on the display portion, as the coordinate position of touch input. A video signal processing portion outputs data corresponding to the coordinate of touch input, i.e., data of a keyboard, as image data to the display portion.

A first display region on which the keyboard is displayed displays a still image in a period in which a user inputs data with the keyboard displayed on the display portion. When the user inputs data, a second display region displays a moving image in a period in which letters or numerals corresponding to keys input by touch are written one after another or in a period in which conversion of letters is performed.

An embodiment of the present invention disclosed in this specification is an electronic system comprising a photo sensor and a display portion performing display by processing input data obtained from the photo sensor to a video signal. In the electronic system, a touch-input button displayed on a first screen region of the display portion is displayed as a still image, and the video signal is output so that a moving image is displayed on a second screen region of the display portion. The electronic system comprises a video signal processing portion switching the first screen region of the display portion to a screen region where touch input is performed or a screen region where the video signal is output to perform display. Alternatively, the electronic system comprises a video signal processing portion supplying different signals between the case where a still image is displayed on the display portion and the case where a moving image is displayed on the display portion. After writing of a still image is performed, a display element control circuit is put in a non-operation state, whereby power consumption can be reduced.

A switching transistor included in a conventional active matrix display device has a problem in that off current is large and a signal written to a pixel leaks to disappear in the transistor even when the transistor is in an off state. According to an embodiment of the present invention, with the use of a transistor including an oxide semiconductor layer as a switching transistor, extremely small off current, specifically, off current density per channel width of 1 μm at room temperature can be less than or equal to 10 aA ($1\times10^{-17}$ A/μm), further, less than or equal to 1 aA ($1\times10^{-18}$ A/μm), or still further, less than or equal to 10 zA ($1\times10^{-20}$ A/μm). In addition, in the pixel, retention time of an electric signal such as an image signal can be longer, and intervals of writing time can be set long. Therefore, with the use of the transistor including an oxide semiconductor, a period in which the display element control circuit in a non-operation state after writing of a still image is prolonged, whereby power consumption can be further reduced.

An embodiment of the present invention relating to a device to realize the system is an electronic device including a display portion having a touch-input function and a first transistor electrically connected to a reflective electrode and a photo sensor over one substrate. In the electronic device, the photo sensor comprises a photodiode, a second transistor comprising a gate signal line electrically connected to the photodiode, and a third transistor, one of a source and a drain of the second transistor is electrically connected to a photo sensor reference signal line, the other of the source and the drain of the second transistor is electrically connected to one of a source and a drain of the third transistor, the other of the source and the drain of the third transistor is electrically connected to a photo sensor output signal line, and an oxide semiconductor layer of the third transistor overlaps with the reflective electrode.

With the above structure, at least one of the above problems can be resolved.

In the above structure, an oxide semiconductor layer of the second transistor overlaps with a reading signal line with a gate insulating layer provided therebetween, and the reading signal line overlaps with a reflective electrode that is a pixel electrode. With a pixel structure in which the reading signal line and the third transistor are provided below the reflective electrode, a light-receiving area of photo sensors and a pixel electrode area (hereinafter, referred to as a reflective electrode area) per unit area can be effectively used.

An embodiment of the present invention is an electronic device including a display portion having a touch-input function and a first transistor electrically connected to a first reflective electrode, a second transistor electrically connected to a second reflective electrode, and a photo sensor over one substrate. In the electronic device, the photo sensor comprises a photodiode, a third transistor comprising a gate signal line electrically connected to the photodiode, and a fourth transistor, one of a source and a drain of the third transistor is electrically connected to a photo sensor reference signal line, the other of the source and the drain of the third transistor is electrically connected to one of a source and a drain of the fourth transistor, the other of the source and the drain of the fourth transistor is electrically connected to a photo sensor output signal line, an oxide semiconductor layer of the fourth transistor overlaps with the first reflective electrode, and the photo sensor reference signal line overlaps with the second reflective electrode.

The above structure is designed so that one light-receiving region of a photo sensor is provided between two reflective electrodes when the pixel structure is seen from above, whereby a light-receiving area of photo sensors and a reflective electrode area per unit area can be effectively used.

In the above structure, an oxide semiconductor layer of the third transistor overlaps with a reading signal line with a gate insulating layer provided therebetween, and the reading signal line overlaps with the first reflective electrode. With a pixel structure in which the reading signal line and the fourth transistor are provided below the first reflective electrode, a light-receiving area of photo sensors and a reflective electrode area per unit area can be effectively used.

In the above structure, one of the source and the drain of the fourth transistor overlaps with the first reflective electrode, and the other of the source and the drain of the fourth transistor overlaps with the second reflective electrode. With such a pixel structure, a light-receiving area of photo sensors and a reflective area per unit area can be effectively used.

In addition, in the above structure, a color filter is provided to overlap with the reflective electrode, whereby full-color display can also be performed.

Further, a reflective liquid crystal device is advantageous for energy saving because displayed contents can be recognized with external light such as sunlight or illumination light even a backlight is not provided.

A portable information terminal in which a moving image and a still image are displayed on one screen can be realized. Driving and supply of a signal are performed in a different manner between in the case where a moving image is displayed on a screen region and the case where a still image is displayed on a screen region, and power consumption for displaying a moving image is reduced as compared to that for displaying a still image. In addition, since a reflective liquid crystal display device is employed, halftone display in grayscale with a wider range of gradation than in the case of an electrophoretic display device can be performed.

In addition, a user can read data regardless of a location, and input data by touching a keyboard displayed on a screen, so that a result of the input can be displayed on the screen on which the keyboard is displayed.

BEST MODE FOR CARRYING OUT THE INVENTION

Hereinafter, embodiments of the present invention are described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, an example of an electronic device including a display portion in which an image is displayed using external light is described with reference to FIGS. 1A and 1B.

Figure 1A:
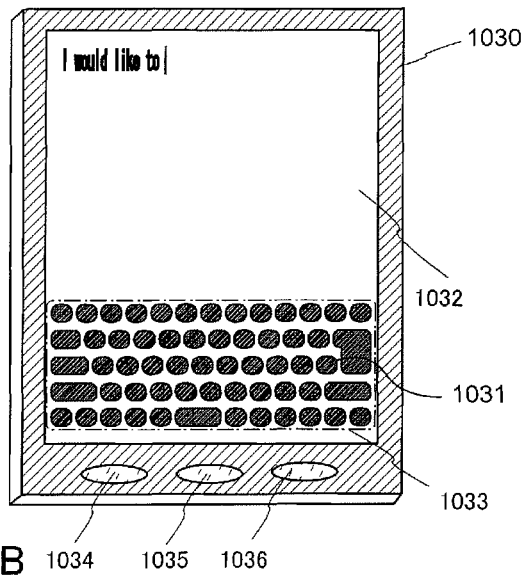
FIGS. 1A and 1B are external views illustrating an embodiment of the present invention.

A display portion 1032 of an electronic device 1030 has a touch-input function with the use of photo sensors, in which a plurality of keyboard buttons 1031 is displayed on a region 1033 in the display portion as illustrated in FIG. 1A. The display portion 1032 indicates the entire display region and includes the region 1033 in the display portion. A user inputs data by touching desired keyboard buttons, whereby a result of the input is displayed on the display portion 1032.

Since the region 1033 in the display portion displays a still image, power consumption can be reduced by putting a display element control circuit in a non-operation state in a period other than writing time.

An example of the usage of the electronic device 1030 is described. For example, letters are input by successively touching the keyboard buttons displayed on the region 1033 in the display portion with all user's fingers or without contact, and text which is displayed as a result of the input is displayed on a region other than the region 1033 in the display portion. After a set period of time in which all output signal of the photo sensor is not detected since the user removes his/her fingers from the display portion, the keyboard displayed on the region 1033 in the display portion is removed automatically and the input text is displayed also on the region 1033 in the display portion, so that the user can see the input text displayed on all the region of the screen. In the case where input is performed again, the keyboard buttons can be displayed on the region 1033 in the display portion again by touch of the display portion 1032 with the user's finger or detection of an output signal of a photo sensor without contact, and input of letters can be performed.

Figure 1B:
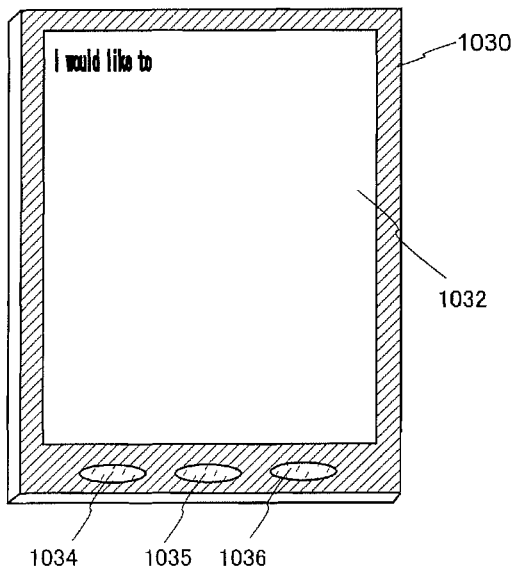

Alternatively, the keyboard can be removed not automatically but by pushing a switch 1034 by the user so that a still image can be displayed on the entire display portion 1032 as illustrated in FIG. 1B. In addition, even when the power is turned off by pushing a power supply switch 1035, the still image can be held for a long time. Further, the keyboard can be displayed by pushing a keyboard display switch 1036 to be in a state where touch-input can be performed.

In addition, the switch 1034, the power supply switch 1035, and the keyboard display switch 1036 may each be displayed on the display portion 1032 as a switch button. Each operation may be performed by input by touching the displayed switch button.

Further, without limitation to the structure in which the region 1033 in the display portion displays a still image, the region 1033 in the display portion may display a moving image temporarily or partly. For example, a position where the keyboard buttons are displayed may be changed temporarily in accordance with user's taste, or in the case where input is performed without contact, only display of a keyboard button by which input is performed may be partly changed in order to confirm that whether the input by the keyboard button is performed.

The electronic device 1030 includes at least a battery, and preferably includes a memory for storing data (e.g., a flash memory circuit, an SRAM circuit, or a DRAM circuit), a central processing unit (CPU), or a logic circuit. With a CPU or a memory, various kinds of software can be installed and thus, the electronic device 1030 can have part or all of the functions of a personal computer.

Next, an example of a display panel included in the display portion 1032 is described with reference to FIG. 2. A display panel 100 includes a pixel circuit 101, a display element control circuit, and a photo sensor control circuit. The pixel circuit 101 includes a plurality of pixels 103 and 104 and a plurality of photo sensors 106 which are arranged in a matrix of rows and columns. Each of the pixels 104 and 103 includes one display element. Although in this embodiment, one photo sensor 106 is provided between the pixel 103 and the pixel 104 and the number of the photo sensors is half of the number of the pixels, an embodiment is not limited thereto. One photo sensor may be provided per one pixel so that the number of the photo sensors is the same as the number of the pixels. Alternatively, the number of the photo sensors may be one third of the number of the pixels.

A display element 105 includes a liquid crystal element including a transistor, a storage capacitor, and a liquid crystal layer, or the like. The transistor has a function of controlling injection or discharge of charge to/from the storage capacitor. The storage capacitor has a function to retain charge which corresponds to voltage applied to the liquid crystal layer. Taking advantage of the change in the direction of a polarization due to a voltage application to the liquid crystal layer, contrast (gray scale) of light passing through the liquid crystal layer is made, so that image display is realized. External light which enters from a surface side of a liquid crystal display device is used as the light passing through the liquid crystal layer.

Further, the display element control circuit is a circuit configured to control the display elements 105 and includes a display element driver circuit 107 which inputs a signal to the display elements 105 through signal lines (also referred to as source signal lines) such as video data signal lines, and a display element driver circuit 108 which inputs a signal to the display elements 105 through scan lines (also referred to as gate signal lines).

For example, the display element driver circuit 108 on the scan line side has a function of selecting the display elements included in the pixels placed in a particular line. The display element driver circuit 107 on the driving the signal line side has a function of applying a predetermined potential to the display elements included in the pixels placed in a selected row. Note that in the display element to which the display element driver circuit 108 on the scan line side applies high potential, the transistor is in a conduction state, so that the display element is supplied with charge from the display element driver circuit 107 on the signal line side.

The photo sensor 106 includes a transistor and a light-receiving element which has a function of generating an electrical signal when receiving light, such as a photodiode.

The photo sensor control circuit is a circuit configured to control the photo sensors 106 and includes a photo sensor reading circuit 109 on the signal line side for a photo sensor output signal line, a photo sensor reference signal line, or the like, and a photo sensor driver circuit 110 on the scan line side. The photo sensor driver circuit 110 on the scan line side has a function of performing reset operation and selecting operation on the photo sensors 106 included in the pixels placed in a particular row, which is described below. Further, the photo sensor reading circuit 109 on the signal line side has a function of taking out an output signal of the photo sensors 106 included in the pixels in the selected row.

Figure 3:
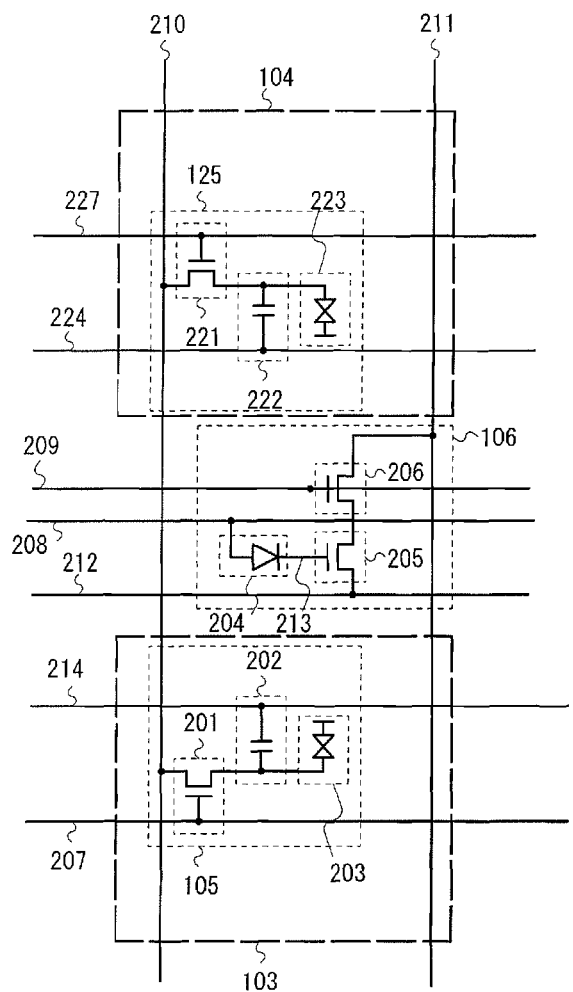
FIG. 3 is an equivalent circuit diagram of a pixel, illustrating an embodiment of the present invention.

A circuit diagram of the pixel 103, the photo sensor 106, and the pixel 104 is described in this embodiment with reference to FIG. 3. The pixel 103 includes the display element 105 including a transistor 201, a storage capacitor 202, and a liquid crystal element 203. The photo sensor 106 includes a photodiode 204, a transistor 205, and a transistor 206. The pixel 104 includes a display element 125 including a transistor 221, a storage capacitor 222, and a liquid crystal element 223.

A gate of the transistor 201 is electrically connected to a gate signal line 207, one of a source and a drain of the transistor 201 is electrically connected to a video data signal line 210, and the other of the source and the drain of the transistor 201 is electrically connected to one electrode of the storage capacitor 202 and one electrode of the liquid crystal element 203. The other electrode of the storage capacitor 202 is electrically connected to a capacitor wiring 214 and held at a fixed potential. The other electrode of the liquid crystal element 203 is held at a fixed potential. The liquid crystal element 203 is an element including a pair of electrodes and a liquid crystal layer provided between the pair of electrodes.

When a potential "H" is applied to the gate signal line 207, the transistor 201 supplies the potential of the video data signal line 210 to the storage capacitor 202 and the liquid crystal element 203. The storage capacitor 202 retains the applied potential. The liquid crystal element 203 changes light transmittance in accordance with the applied potential.

One electrode of the photodiode 204 is electrically connected to a photodiode reset signal line 208, and the other electrode of the photodiode 204 is electrically connected to a gate of the transistor 205. One of a source and a drain of the transistor 205 is electrically connected to a photo sensor reference signal line 212, and the other of the source and the drain of the transistor 205 is electrically connected to one of a source and a drain of the transistor 206. A gate of the transistor 206 is electrically connected to a reading signal line 209, and the other of the source and the drain of the transistor 206 is electrically connected to a photo sensor output signal line 211.

A gate of the transistor 221 is electrically connected to a gate signal line 227, one of a source and a drain of the transistor 221 is electrically connected to the video data signal line 210, and the other of the source and the drain of the transistor 221 is electrically connected to one electrode of the storage capacitor 222 and one electrode of the liquid crystal element 223. The other electrode of the storage capacitor 222 is electrically connected to a capacitor wiring 224 and held at a fixed potential. The other electrode of the liquid crystal element 223 is held at a fixed potential. The liquid crystal element 223 includes a pair of electrodes and a liquid crystal layer provided between the pair of electrodes.

Next, an example of a structure of the photo sensor reading circuit 109 is described with reference to FIG. 3 and FIG. 4. For example, the display portion includes pixels provided in 1024 rows and 768 columns. One display element is provided in one pixel in each row and each column and one photo sensor is provided between two pixels for two rows and one column. That is, the display elements are provided in 1024 rows and 768 columns, and the photo sensors are provided in 512 rows and 768 columns. In addition, this embodiment describes an example in which output to the outside of the display device is performed in the case where photo sensor output signal lines in two columns are regarded as one pair. That is, one output is obtained from two photo sensors provided between four pixels in two rows and two columns.

FIG. 3 illustrates a circuit configuration of pixels, in which two pixels and one photo sensor for two rows and one column are illustrated. One display element is provided in one pixel and one photo sensor is provided between two pixels. FIG. 4 illustrates a circuit configuration of the photo sensor reading circuit 109, in which some photo sensors are illustrated for explanation.

Figure 4:
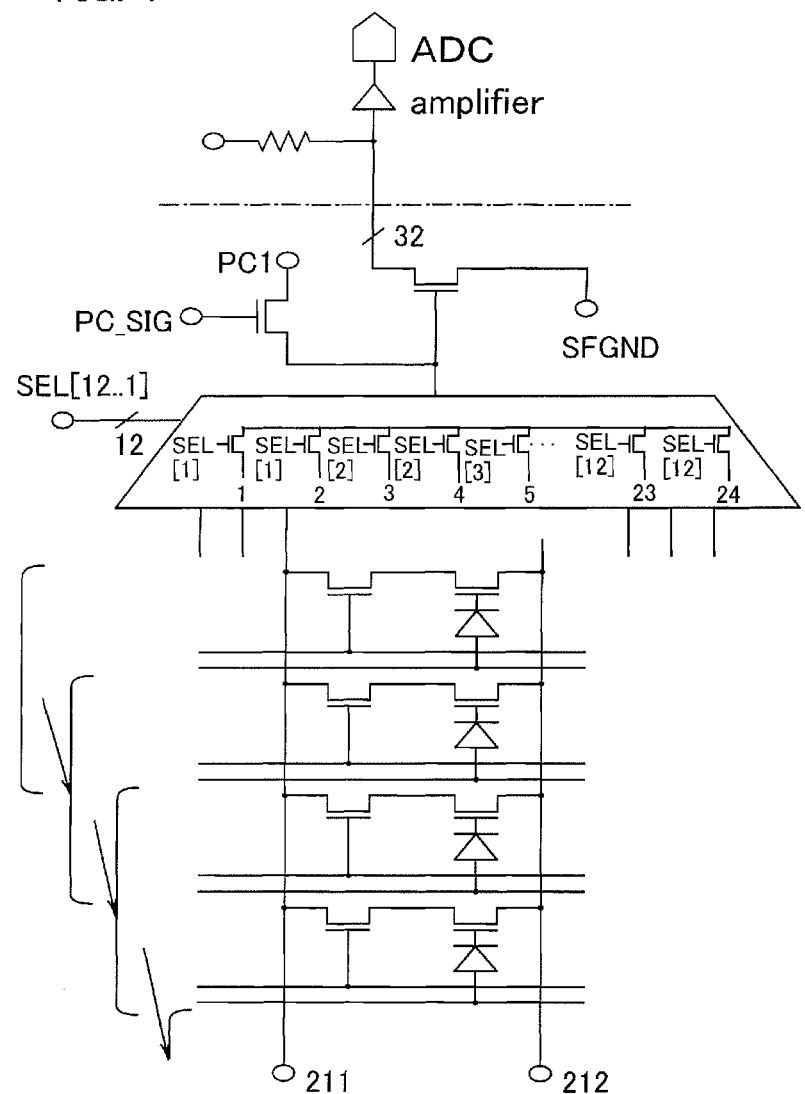
FIG. 4 is a schematic view of a driver circuit for photo sensors, illustrating an embodiment of the present invention.

As illustrated in FIG. 4, an example of a driving method is considered, in which a scan line driver circuit for photo sensors drives pixels for four rows (that is, photo sensors for two rows) concurrently, and shifts selected rows by one row including photo sensors corresponding to pixels for two rows. Here, photo sensors in each row are continually selected in a period in which the scan line driver circuit shifts selected rows twice. Such a driving method makes it easier to improve frame frequency at the time of imaging by a photo sensor. In particular, it is advantageous in the case of a large-sized display device. Note that outputs of photo sensors for two rows are superimposed on the photo sensor output signal line 211 at one time. All of the photo sensors can be driven by repeating shift of selected rows 512 times.

As illustrated in FIG. 4, in the photo sensor reading circuit 109, one selector is provided per pixels for 24 rows. The selector selects 1 pair from 12 pairs of photo sensor output signal lines 211 (1 pair corresponds to photo sensor output signal lines 211 for two columns) in the display portion and obtains an output. In other words, the photo sensor reading circuit 109 includes 32 selectors in total and obtains 32 outputs at one time. Selection is performed on all of the 12 pairs in each of the selectors, whereby 384 outputs which correspond to photo sensors for one row can be obtained in total. The selector selects 1 pair from the 12 pairs every time selected rows are shifted by the scan line driver circuit of photo sensors, whereby outputs from all of the photo sensors can be obtained.

In this embodiment, as illustrated in FIG. 4, the following structure is considered: the photo sensor reading circuit 109 on the signal line side takes out outputs of photo sensors, which are analog signals, to the outside of the display device, and the outputs are amplified with the use of an amplifier provided outside the display device and converted to digital signals with the use of an AD converter. Needless to say, the following structure may be employed: the AD converter is mounted on a substrate over which the display device is provided, and the outputs of photo sensors are converted to digital signals and then the digital signals are taken out to the outside of the display device.

In addition, operation of individual photo sensors is realized by repeating reset operation, accumulating operation, and selecting operation. The "reset operation" refers to operation in which the potential of the photodiode reset signal line 208 is set to a potential "H". When the reset operation is performed, the photodiode 204 is in a conduction state, and the potential of a gate signal line 213 connected to the gate of the transistor 205 is set to a potential "H".

The "accumulating operation" refers to operation in which the potential of the photodiode reset signal line 208 is set to a potential "L" after the reset operation. Further, the "selecting operation" refers to operation in which the potential of the reading signal line 209 is set to a potential "H" after the accumulating operation.

When the accumulating operation is performed, the potential of the gate signal line 213 to which the gate of the transistor 205 is connected is reduced as light with which the photodiode 204 is irradiated is stronger, and a channel resistance of the transistor 205 is increased. Therefore, when the selecting operation is performed, a current which flows to the photo sensor output signal line 211 through the transistor 206 is small. On the other hand, as the light with which the photodiode 204 is irradiated is weaker at the time of the accumulating operation, a current which flows to the photo sensor output signal line 211 through the transistor 206 is increased at the time of the selecting operation.

In this embodiment, when the reset operation, the accumulating operation, and the selecting operation are performed on the photo sensors, a partial shadow of external light can be detected. In addition, when image processing or the like is performed on the detected shadow appropriately, a position where a finger, a stylus pen, or the like touches the display device can be recognized. Operation corresponding to the position where the display device is touched, for example, as for input of letters, kinds of letters are regulated in advance, so that desired letters can be input.

Note that in this display device in this embodiment, the partial shadow of external light is detected by the photo sensors. Therefore, even if a finger, a stylus pen, or the like does not touch the display device physically, when the finger, the stylus pen, or the like gets close to the display device without contact and a shadow is formed, detection of the shadow is possible. Hereinafter, "a finger, a stylus pen, or the like touches the display device" includes the case where the finger, the stylus pen, or the like is close to the display device without contact.

With the above structure, the display portion 1032 can have a touch-input function.

In the case where touch input is performed, the display device has a structure in which an image partly including a still image such as a keyboard is displayed and input is performed by touching a position where a keyboard or a desired letter is displayed with a finger or a stylus pen, whereby operability is improved. In the case where such a display device is realized, power consumption in the display device can be considerably reduced in the following manner. That is, in a first screen region where the still image is displayed on the display portion, it is effective that supply of power to display elements in the first screen region is stopped after the still image is displayed and that a state in which the still image can be seen is kept for a long time after the stop of supply. In a second screen region that is the rest of the display portion, a result from the touch input is displayed, for example. The display element control circuit is in a non-operation state in a period other than the time of updating the displayed image in the second screen region, whereby power can be saved. A driving method which enables the above control is described below.

Figure 5:
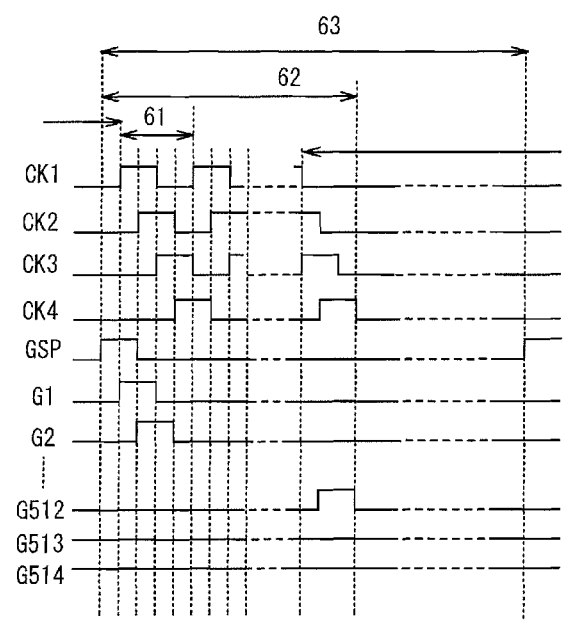
FIG. 5 is a timing chart showing an embodiment of the present invention.

For example, FIG. 5 shows a timing chart of a shift register of the scan line driver circuit in the display device including the display portion in which the display elements are arranged in 1024 rows and 768 columns. A period 61 in FIG. 5 corresponds to one cycle period (64.8 μsec) of a clock signal. A period 62 corresponds to a period (8.36 msec) which is needed for finishing writing of the display elements from a 1st to 512th rows corresponding to the second screen region. A period 63 corresponds to one frame period (16.7 msec).

Here, the shift register of the scan line driver circuit is a four-phase-clock-type shift register which is operated by a first clock signal CK1 to a fourth clock signal CK4. In addition, the first clock signal CK1 to the fourth clock signal CK4 are signals which are different by a quarter of one cycle period from each other. When a start pulse signal GSP is set to a potential "H", a gate signal line G1 in a 1st row to a gate signal line G512 in a 512th row are set to a potential "H" in sequence with a delay of a quarter of one cycle period. In addition, each of the gate signal lines is set at a potential "H" during half of one cycle period, and two gate signal lines in successive rows are set at a potential "H" concurrently during quarter of one cycle period.

Here, the display elements in each row are continuously selected in a period in which the scan line driver circuit shifts selected rows twice. When data of the displayed image are input in the latter half of a period in which the display elements in the row are selected, the displayed image can be updated.

Here, in a period other than a period in which the displayed image by the display elements from the 1st row to the 512th row which correspond to the second screen region is updated, the display element control circuit is in a non-operation state. That is, the displayed image by display elements in a 513th row to a 1024th row corresponding to the first screen region is not updated and the display element control circuit is in a non-operation state.

The non-operation state of the display element control circuit can be realized by stopping the clock signal (keeping a clock signal at a potential "L") as shown in FIG. 5. It is effective to stop of supply of power supply voltage at the same time as the stop of the clock signal.

In addition, supply of a clock signal and a start pulse signal may be stopped also in the driver circuit on the source in a period in which the display elements corresponding to the second screen region are not selected, that is, in a period in which the displayed image is not updated. In such a manner, power can be further saved.

Embodiment 2

Figure 2:
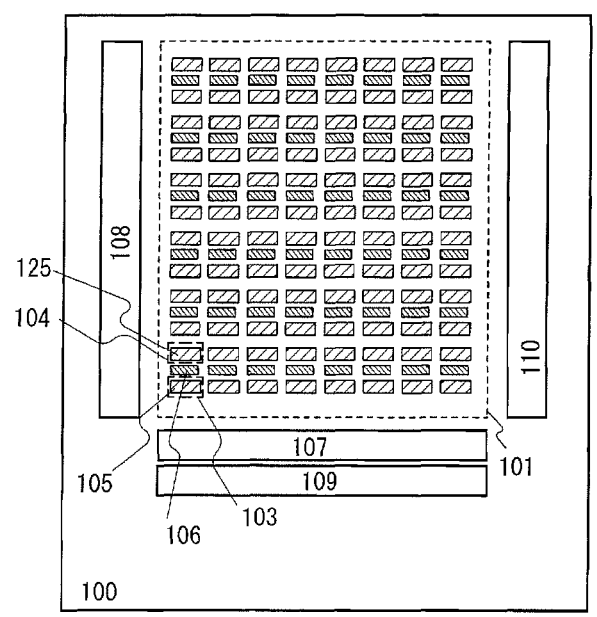
FIG. 2 is a block diagram illustrating an embodiment of the present invention.

A pixel structure corresponding to FIG. 2 and FIG. 3 described in Embodiment 1 is described in this embodiment with reference to FIG. 6, FIG. 7, and FIGS. 8A and 8B. Note that the portions which are the same as those in FIG. 2 and FIG. 3 are described using the same reference numerals in the description for FIG. 6, FIG. 7, and FIGS. 8A and 8B.

Figure 6:
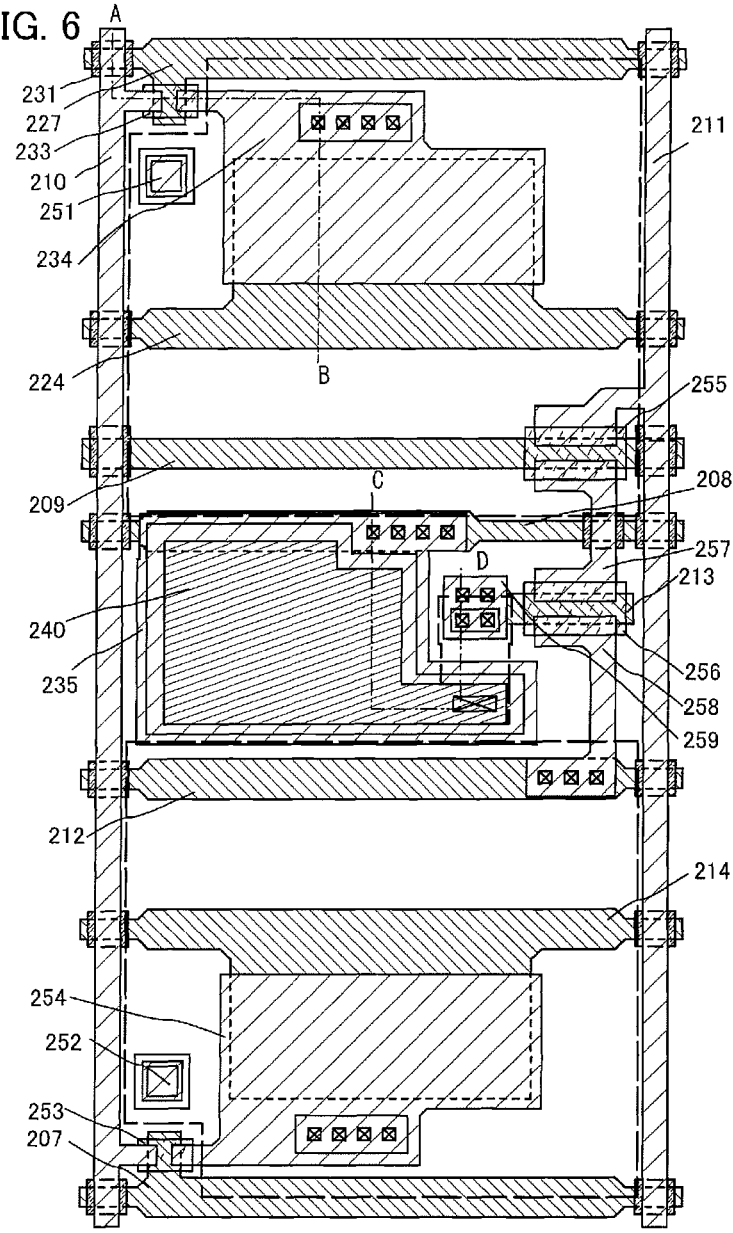
FIG. 6 is an example of a plan view of a pixel, illustrating an embodiment of the present invention.

FIG. 6 illustrates an example of a plan view of a pixel, corresponding to the circuit diagram of FIG. 3. In addition, FIG. 6 illustrates a state before an electrode of a photodiode is formed and corresponds to a cross-sectional view of FIG. 8A. Note that a cross-sectional view taken along a chain line A-B and a cross-sectional view taken along a chain line C-D in FIG. 6 correspond to FIG. 8A.

First, a conductive film is formed over a substrate 230. Then, gate signal lines 207, 213, and 227, a capacitor wiring 224, a photodiode reset signal line 208, a reading signal line 209, and a photo sensor reference signal line 212 are formed through a first photolithography step with the use of a first light-exposure mask. In this embodiment, a glass substrate is used as the substrate 230.

An insulating film serving as a base film may be provided between the substrate 230 and the conductive film. The base film has a function of preventing diffusion of impurity elements from the substrate 230, and can be formed to have a single-layer structure or a stacked structure using one or more of a silicon nitride film, a silicon oxide film, a silicon nitride oxide film, and a silicon oxynitride film.

The conductive film can be formed to have a single-layer or stacked structure using a metal material such as molybdenum, titanium, tantalum, tungsten, aluminum, copper, neodymium, or scandium, or all alloy material which includes any of these materials as a main component.

Then, an insulating layer covering these wirings is formed, and selective etching is performed through a second photolithography step with the use of a second light-exposure mask so that an insulating layer 231 remains only in a portion intersecting a wiring which is to be formed later. In this embodiment, a silicon oxynitride film with a thickness of 600 nm is used as the insulating layer 231.

Next, a gate insulating layer 232 and an oxide semiconductor film are formed, and then, a first oxide semiconductor layer 233, a second oxide semiconductor layer 253, a third oxide semiconductor layer 255, and a fourth oxide semiconductor layer 256 are formed through a third photolithography step with the use of a third light-exposure mask. The first oxide semiconductor layer 233, the second oxide semiconductor layer 253, the third oxide semiconductor layer 255, and the fourth oxide semiconductor layer 256 overlap with the gate signal line 227, the gate signal line 207, the reading signal line 209, and the gate signal line 213, respectively with the gate insulating layer 232 provided therebetween. In this embodiment, a silicon oxynitride film with a thickness of 100 nm is used as the gate insulating layer 232, and an In—Ga—Zn—O film with a thickness of 25 nm is used as the oxide semiconductor film.

An oxide thin film represented by a chemical formula of $InMO_3(ZnO)_m$ (m>0, where m is not an integer) can be used for the first oxide semiconductor layer 233, the second oxide semiconductor layer 253, the third oxide semiconductor layer 255, and the fourth oxide semiconductor layer 256. Here, M represents one or more metal elements selected from Ga, Al, Mn, and Co. For example, M can be Ga, Ga and Al, Ga and Mn, Ga and Co, or the like. Further, $SiO_2$ may be contained in the above oxide thin film.

When an In—Ga—Zn—O film is deposited using an oxide target having a composition ratio of $In_2O_3:Ga_2O_3:ZnO=1:1:1$ [molar ratio] as a target for forming the oxide thin film by a sputtering method. Without limitation to the material and the component of the target, for example, an oxide target having a composition ratio of $In_2O_3:Ga_2O_3:ZnO=1:1:2$ [molar ratio] may be used. Note that in this specification, for example, an In—Ga—Zn—O film refers to an oxide film containing indium (In), gallium (Ga), and zinc (Zn), and there is no particular limitation on the stoichiometric proportion.

Next, the oxide semiconductor layers are subjected to first heat treatment. The oxide semiconductor layers can be dehydrated or dehydrogenated by this first heat treatment. The temperature of the first heat treatment is higher than or equal to 400° C. and lower than or equal to 750° C., preferably higher than or equal to 400° C. and lower than the strain point of the substrate. In embodiment, a rapid thermal anneal (RTA) apparatus is used, heat treatment is performed in a nitrogen atmosphere at 650° C. for six minutes, the substrate is introduced, without exposure to the air, into an electric furnace that is one kind of a heat treatment apparatus, and heat treatment is performed in a nitrogen atmosphere at 450° C. for one hour for the oxide semiconductor layers. Then, the substrate is transferred into the deposition chamber of the oxide semiconductor layers so as not to be exposed to the air in order to prevent mixing of water or hydrogen to the oxide semiconductor layers, whereby the oxide semiconductor layers are obtained.

Next, the gate insulating layer 232 is selectively removed through a fourth photolithography step with the use of a fourth light-exposure mask, so that an opening reaching the gate signal line 213 and an opening reaching the photodiode reset signal line 208 are formed.

Next, a conductive film is formed over the gate insulating layer 232 and the oxide semiconductor layer. The conductive film can be formed using a metal film containing an element selected from Al, Cr, Cu, Ta, Ti, Mo, and W as its component, an alloy film containing a nitride of any of these elements as its component, an alloy film containing a combination of any of these elements, or the like. Then, a resist mask is formed over the conductive film through a fifth photolithography step with the use of a fifth light-exposure mask, and selective etching is performed, so that a video data signal line 210, a photo sensor output signal line 211, and electrode layers 234, 235, 254, 257, 258, and 259 are formed.

Note that a transistor 221 illustrated in FIG. 3 includes the first oxide semiconductor layer 233 and the electrode layer 234 serving as a source electrode layer or a drain electrode layer as illustrated in FIG. 6. In addition, as illustrated in FIG. 6, the electrode layer 234, the gate insulating layer 232 serving as a dielectric, and the capacitor wiring 224 form a storage capacitor 222. Further, as illustrated in FIG. 6, a transistor 201 includes the second oxide semiconductor layer 253 and the electrode layer 254 serving as a source electrode layer or a drain electrode layer.

Figure 8:
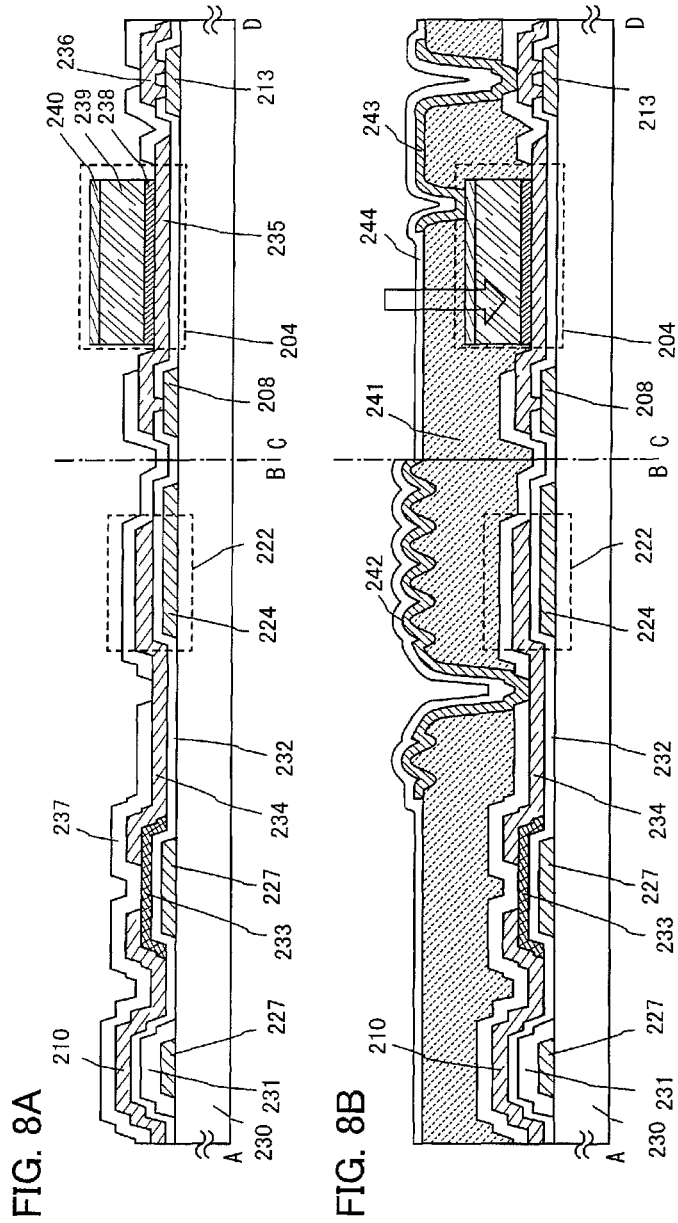
FIGS. 8A and 8B are each an example of a cross-sectional view illustrating an embodiment of the present invention.

Furthermore, a transistor 206 that is one of the elements included in a photo sensor 106 in FIG. 3 includes the third oxide semiconductor layer 255 and the electrode layer 257 serving as a source electrode layer or a drain electrode layer as illustrated in FIG. 6. In addition, a transistor 205 includes the fourth oxide semiconductor layer 256 and the electrode layer 257 or the electrode layer 258 which serves as a source electrode layer or a drain electrode layer as illustrated in FIG. 6. As illustrated in FIG. 8A, the gate signal line 213 of the transistor 205 is electrically connected to the electrode layer 236.

Next, second heat treatment is performed in an inert gas atmosphere or oxygen gas atmosphere (preferably at a temperature higher than or equal to 200° C. and lower than or equal to 400° C., for example, higher than or equal to 250° C. and lower than or equal to 350° C.). In this embodiment, the second heat treatment is performed at 300° C. for one hour in a nitrogen atmosphere. In the second heat treatment, heating is performed while part (a channel formation region) of the oxide semiconductor layer is in contact with the insulating layer.

Next, an insulating layer 237 serving as a protective insulating layer is formed, and a sixth photolithography step is performed with the use of a sixth light-exposure mask, so that an opening reaching the electrode layer 235, an opening reaching the electrode layer 234, and an opening reaching the electrode layer 236 are formed.

Then, a p-layer 238, an i-layer 239, and an n-layer 240 are deposited using a plasma CVD method. In this embodiment, a microcrystalline silicon film containing boron with a thickness of 45 nm is used as the p-layer 238, an amorphous silicon film with a thickness of 400 nm is used as the i-layer 239, and a microcrystalline silicon film containing phosphorus with a thickness of 80 nm is used as the n-layer 240. Then, the p-layer 238, the i-layer 239, and the n-layer 240 are removed through a seventh photolithography step with the use of a seventh light-exposure mask so that only parts of the p-layer 238, the i-layer 239, and the n-layer 240 in a region in contact with and overlapping with the electrode layer 235 is left. FIG. 8A is a cross-sectional view up to this stage and a plan view thereof corresponds to FIG. 6.

Next, an eight photolithography step is performed in which a photosensitive organic resin layer is formed, a region in which an opening is to be formed is exposed to light with the use of an eighth light-exposure mask, a region to have an uneven shape is exposed to light with the use of a ninth light-exposure mask, development is performed, and an insulating layer 241 partly having an uneven shape is formed.

Then, a conductive film having reflectivity is deposited, a ninth photolithography step is performed with the use of a tenth light-exposure mask, so that a reflective electrode layer 242 and a connection electrode layer 243 are formed. Al, Ag, or an alloy of any of these, such as aluminum containing Nd or an Ag—Pd—Cu alloy, is used for the conductive film having reflectivity. Then, after the ninth photolithography step is performed, in this embodiment, third heat treatment is performed in a nitrogen atmosphere at 250° C. for one hour.

Through the above steps, a transistor electrically connected to the reflective electrode layer 242 and a photodiode electrically connected to the gate signal line 213 through the electrode layer 236 and the connection electrode layer 243 can be formed over one substrate through the nine photolithography steps with the use of the ten light-exposure masks in total.

Then, an alignment film 244 covering the reflective electrode layer 242 is formed. A cross-sectional view at this stage corresponds to FIG. 8B. Thus, an active matrix substrate can be manufactured.

A counter substrate which is attached to this active matrix substrate is prepared. Over the counter substrate, a light-blocking layer (also referred to as a black matrix) and a light-transmitting conductive film are formed and a columnar spacer using an organic resin is formed. Lastly, the resulting counter substrate is covered with an alignment film.

The counter substrate is attached to the active matrix substrate with a sealant, and a liquid crystal layer is sandwiched between the pair of substrates. The light-blocking layer of the counter substrate is provided so as not to overlap with a display region of the reflective electrode layer 242 and a light-receiving region of a photo sensor. In addition, the columnar spacer provided in the counter substrate is positioned so as to overlap with electrode layers 251 and 252. The columnar spacer overlaps with the electrode layers 251 and 252, thereby keeping a constant gap between the pair of substrate. Note that the electrode layers 251 and 252 can be formed in the same step as the electrode layer 234; therefore, the electrode layers 251 and 252 can be provided without an increase in the number of masks.

Figure 7:
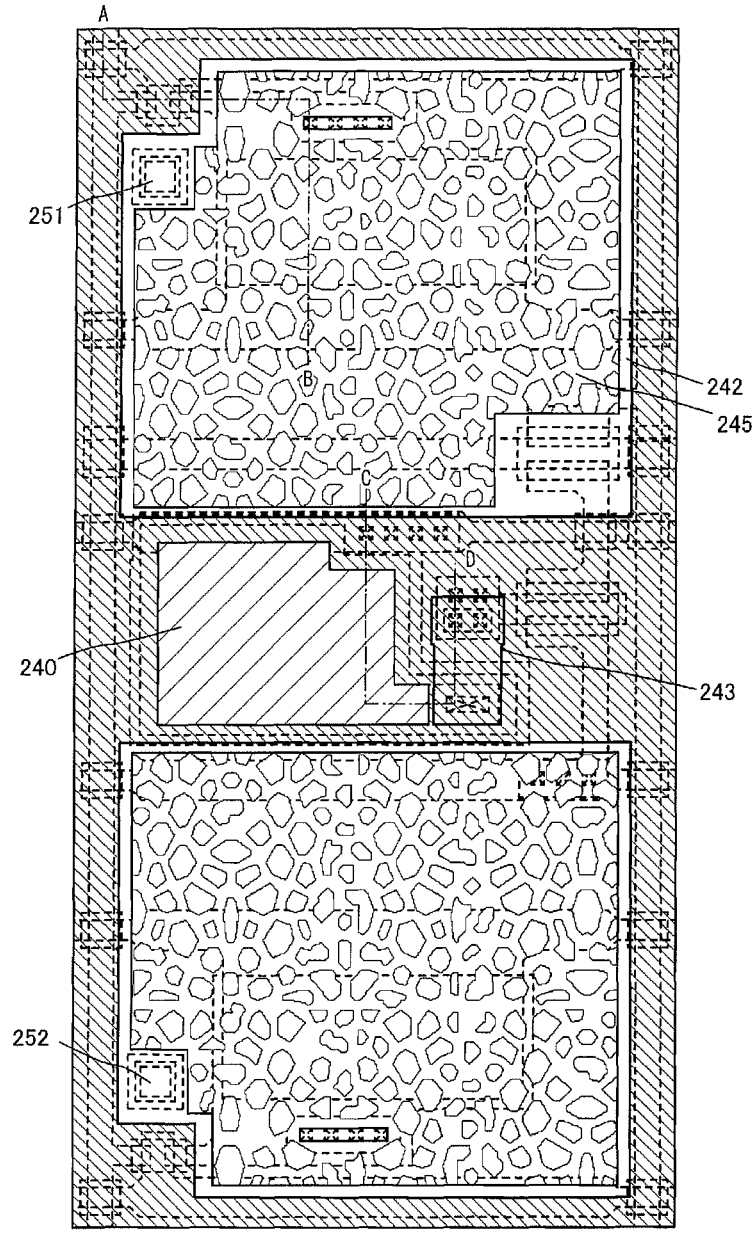
FIG. 7 is an example of a plan view showing positional relation between a reflective electrode and a black matrix, illustrating an embodiment of the present invention.

A plan view of the pixels for the pair of substrate which are attached to each other in this manner corresponds to FIG. 7. In FIG. 7, a region which does not overlap with the black matrix serves as a light-receiving region of a photo sensor and a display region. The proportion of the area of the reflective electrode in a unit area (120 μm×240 μm) illustrated in FIG. 7 is 59.4%. The area of the light-receiving region of photo sensors is approximately 1700 μm². In addition, since the reflective electrode layer 242 is provided over the photosensitive organic resin layer having an uneven portion, the reflective electrode layer 242 has a random plane pattern as illustrated in FIG. 7. A surface shape of the photosensitive organic resin layer is reflected on a surface of the reflective electrode layer 242 so that the surface of the reflective electrode layer 242 has an uneven shape, so that specular reflection is prevented. Note that in FIG. 7, a recessed portion 245 of the reflective electrode layer 242 is also illustrated. The periphery of the recessed portion 245 is positioned inside the periphery of the reflective electrode layer, and the photosensitive organic resin layer below the recessed portion 245 has a smaller thickness than other regions.

If needed, a surface of the counter substrate where external light enters may be provided with a phase-difference film for adjustment of a phase difference, a film having a function of polarizing light, an anti-reflective plate, or an optical film such as a color filter.

Embodiment 3

In this embodiment, an example of a liquid crystal display module capable of full-color display in which a color filter is provided is described.

Figure 9:
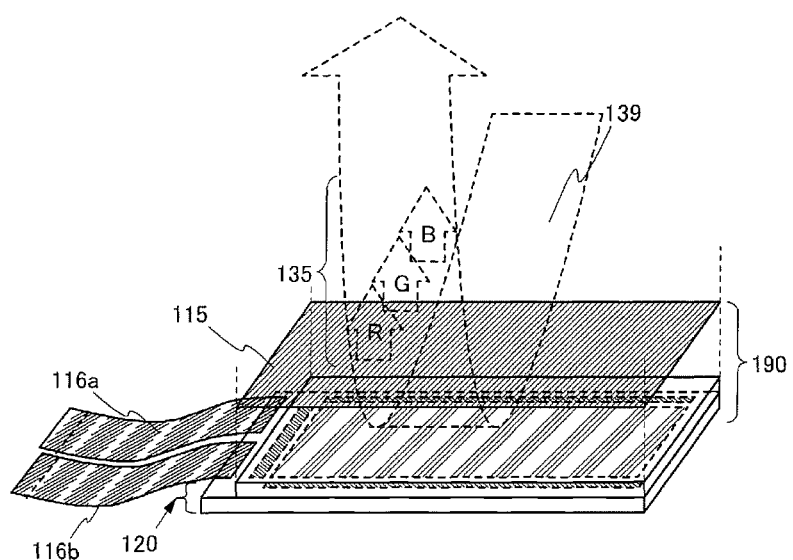
FIG. 9 is a schematic view of a liquid crystal display module, illustrating an embodiment of the present invention.

FIG. 9 illustrates a structure of a liquid crystal display module 190. The liquid crystal display module 190 includes a display panel 120 in which liquid crystal elements are provided in a matrix, and a polarizing plate and a color filter 115 which overlap with the display panel 120. In addition, flexible printed circuits (FPCs) 116a and 116b serving as external input terminals are electrically connected to a terminal portion provided in the display panel 120. The display panel 120 has the same structure as the display panel 100 described in Embodiment 1. Note that since full-color display is employed, the display panel 120 uses three display elements of a red display element, a green display element, and a blue display element and has a circuit configuration in which the three display elements are supplied with respective video signals different from each other.

Further, FIG. 9 schematically illustrates a state in which external light 139 is transmitted through the liquid crystal elements over the display panel 120 and reflected at the reflective electrode. For example, in a pixel overlapping with a red region of the color filter, the external light 139 is transmitted through the color filter 115 and then through the liquid crystal layer, reflected at the reflective electrode, and transmitted again through the color filter 115 to be extracted as red light. FIG. 9 schematically illustrates light 135 of three colors by arrows (R, G, and B). The intensity of the light which is transmitted through the liquid crystal elements is modulated by an image signal. Therefore, a viewer can capture an image by reflection light of the external light 139.

In addition, the display panel 120 includes photo sensors and has a touch-input function. When the color filter also overlaps with a light-receiving region of photo sensors, the display panel 120 can have a function of a visible light sensor. Further, in order to improve the optical sensitivity of the photo sensor, a large amount of incident light is taken in. Therefore, an opening may be provided in the color filter in a region overlapping with the light-receiving region of photo sensors so that the light-receiving region of photo sensors and the color filter do not overlap with each other.

This embodiment can be freely combined with Embodiment 1 or Embodiment 2.

Embodiment 4

In this embodiment, an example of an electronic device including the liquid crystal display device described in any of the above embodiments is described.

Figure 10A:
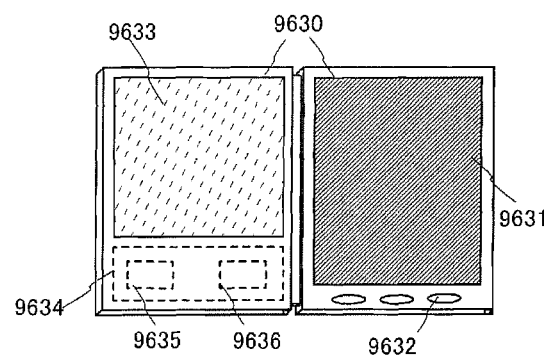
FIGS. 10A and 10B are an external view and a block diagram of a display device which is an embodiment of the present invention.

FIG. 10A illustrates an electronic book reader (also referred to as an e-book reader) which can include housings 9630, a display portion 9631, operation keys 9632, a solar cell 9633, and a charge and discharge control circuit 9634. The electronic book reader is provided with the solar cell 9633 and a display panel so that the solar cell 9633 and the display panel can be opened and closed freely. In the electronic book reader, power from the solar cell is supplied to the display panel or a video signal processing portion. The electronic book reader illustrated in FIG. 10A can have a function of displaying various kinds of data (e.g., a still image, a moving image, and a text image), a function of displaying a calendar, a date, the time, or the like on the display portion, a touch-input function of operating or editing the information displayed on the display portion by touch input, a function of controlling processing by various kinds of software (programs), and the like. Note that in FIG. 10A, a structure including a battery 9635 and a DCDC converter (hereinafter abbreviated as a converter 9636) is illustrated as an example of the charge and discharge control circuit 9634.

The display portion 9631 is a reflective liquid crystal display device having a touch-input function with the use of photo sensors and is used in a comparatively bright environment. Therefore, the structure illustrated in FIG. 10A is preferable because power generation by the solar cell 9633 and charge in the battery 9635 can be performed effectively. Note that a structure in which the solar cell 9633 is provided on each of a surface and a rear surface of the housing 9630 is preferable in order to charge the battery 9635 efficiently. When a lithium ion battery is used as the battery 9635, there is an advantage of downsizing or the like.

Figure 10B:
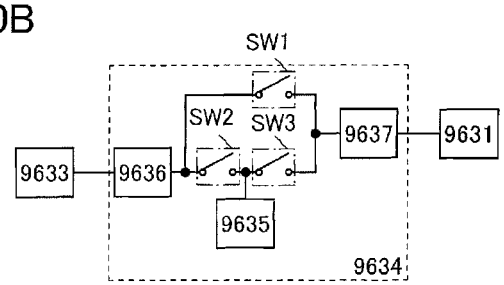

The structure and the operation of the charge and discharge control circuit 9634 illustrated in FIG. 10A are described with reference to a block diagram in FIG. 10B. The solar cell 9633, the battery 9635, the converter 9636, the converter 9637, switches SW1 to SW3, and the display portion 9631 are shown in FIG. 10B, and the battery 9635, the converter 9636, the converter 9637, and the switches SW1 to SW3 correspond to the charge and discharge control circuit 9634.

First, an example of operation in the case where power is generated by the solar cell 9633 using external light is described. The voltage of power generated by the solar cell is raised or lowered by the converter 9636 so that the power has a voltage for charging the battery 9635. Then, when the power from the solar cell 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and a switch SW2 is turned on so that charge of the battery 9635 may be performed.

Note that although the solar cell 9633 is described as an example of a means for charge, charge of the battery 9635 may be performed with another means. In addition, a combination of the solar cell 9633 and another means for charge may be used.

This embodiment can be implemented in appropriate combination with any of the structures described in the other embodiments.

This application is based on Japanese Patent Application serial no. 2010-010391 filed with Japan Patent Office on Jan. 20, 2010, the entire contents of which are hereby incorporated by reference.

The invention claimed is:

1. An electronic system comprising:
a photo sensor;
a display portion performing display by processing input data obtained from the photo sensor to a video signal; and
a scan line driver circuit electrically connected to the display portion,
wherein a touch-input button is displayed on a first screen region of the display portion as a still image,
wherein the video signal is output so that a moving image is displayed on a second screen region of the display portion,
wherein one frame period consists of a first period and a second period,
wherein the touch-input button is displayed on the first screen region of the display portion as the still image during the first period and the second period,
wherein the second screen region is updated in the second period and is not updated in the first period,
wherein the first screen region is not updated in both the first period and the second period,
wherein a clock signal is input to the scan line driver circuit during the second period, and the clock signal is not input to the scan line driver circuit in the first period, and
wherein the display portion comprises a pixel comprising a transistor comprising a channel formation region in an oxide semiconductor layer.

2. The electronic system according to claim 1, further comprising a video signal processing portion switching the first screen region of the display portion to a screen region where touch input is performed or a screen region where the video signal is output to perform display.

3. The electronic system according to claim 1, further comprising a video signal processing portion supplying different signals between when the still image is displayed on the display portion and when the moving image is displayed on the display portion.

4. The electronic system according to claim 1, wherein supply of power supply voltage to the scan line driver circuit is stopped in the first period.

5. The electronic system according to claim 1, wherein the photo sensor comprises a photodiode and a transistor which comprises a channel formation region in an oxide semiconductor layer.

6. The electronic system according to claim 5, wherein an off-state current of the transistor is less than or equal to $1 \times 10^{-17}$ A/μm.

7. An electronic system comprising:
a display portion performing display by processing input data obtained from a photo sensor to a video signal, including a first screen region and a second screen region, the first screen region and the second screen region each comprising:
a first transistor comprising a gate terminal electrically connected to a gate signal line;
a reflective electrode electrically connected to one of a source terminal and a drain terminal of the first transistor; and
the photo sensor, wherein the photo sensor comprises:
a photodiode;
a second transistor comprising a gate terminal electrically connected to the photodiode; and
a third transistor comprising a channel formation region in an oxide semiconductor layer; and
a scan line driver circuit electrically connected to the gate signal line,
wherein one of a source terminal and a drain terminal of the second transistor is electrically connected to a photo sensor reference signal line,
wherein the other of the source terminal and the drain terminal of the second transistor is electrically connected to one of a source terminal and a drain terminal of the third transistor,
wherein the other of the source terminal and the drain terminal of the third transistor is electrically connected to a photo sensor output signal line,
wherein one frame period consists of a first period and a second period,
wherein a still image is displayed on the first screen region of the display portion during the first period and the second period,
wherein the second screen region is updated in the second period and is not updated in the first period,
wherein the first screen region is not updated in both the first period and the second period,
wherein a clock signal is input to the scan line driver circuit during the second period, and the clock signal is not input to the scan line driver circuit in the first period, and
wherein the first transistor comprises a channel formation region in an oxide semiconductor layer.

8. The electronic system according to claim 7,
wherein the oxide semiconductor layer of the third transistor and a reading signal line overlap each other with a gate insulating layer provided therebetween, and
wherein the reading signal line and the reflective electrode overlap each other.

9. The electronic system according to claim 7, wherein the second transistor comprises a channel formation region in an oxide semiconductor layer.

10. The electronic system according to claim 7, wherein the first screen region and the second screen region each comprises a liquid crystal element.

11. The electronic system according to claim 7, wherein the photodiode is electrically connected to a photodiode reset signal line.

12. The electronic system according to claim 7, wherein power supply voltage is not supplied to the scan line driver circuit during the first period.

13. The electronic system according to claim 7,
wherein the first screen region displays a touch-input button as the still image, and
wherein the second screen region displays a moving image in response to the video signal.

14. The electronic system according to claim 7, wherein an off-state current of the third transistor is less than or equal to $1 \times 10^{-17}$ A/μm.

15. An electronic system comprising:
a display portion performing display by processing input data obtained from a photo sensor to a video signal, including a first screen region and a second screen region, the first screen region and the second screen region each comprising:
a first transistor comprising a gate terminal electrically connected to a gate signal line;
a display element electrically connected to one of a source terminal and a drain terminal of the first transistor; and
the photo sensor, wherein the photo sensor comprises:
a photodiode;
a second transistor comprising a gate terminal electrically connected to the photodiode; and
a third transistor; and
a scan line driver circuit electrically connected to the gate signal line,
wherein one of a source terminal and a drain terminal of the second transistor is electrically connected to a photo sensor reference signal line,
wherein the other of the source terminal and the drain terminal of the second transistor is electrically connected to one of a source terminal and a drain terminal of the third transistor,
wherein the other of the source terminal and the drain terminal of the third transistor is electrically connected to a photo sensor output signal line,
wherein one frame period consists of a first period and a second period,
wherein a still image is displayed on the first screen region of the display portion during the first period and the second period,
wherein the second screen region is updated in the second period and is not updated in the first period,
wherein the first screen region is not updated in both the first period and the second period, and
wherein a clock signal is input to the scan line driver circuit during the second period, and the clock signal is not input to the scan line driver circuit in the first period, and
wherein the first transistor comprises a channel formation region in an oxide semiconductor layer.

16. The electronic system according to claim 15,
wherein the third transistor comprises a channel formation region in an oxide semiconductor layer,
wherein the display element includes a reflective electrode, and
wherein the oxide semiconductor layer of the third transistor and the reflective electrode overlap each other.

17. The electronic system according to claim 16,
wherein the oxide semiconductor layer of the third transistor and a reading signal line overlap each other with a gate insulating layer provided therebetween, and
wherein the reading signal line and the reflective electrode overlap each other.

18. The electronic system according to claim 16, wherein an off-state current of the third transistor is less than or equal to $1 \times 10^{-17}$ A/μm.

19. The electronic system according to claim 15, wherein the second transistor comprises a channel formation region in an oxide semiconductor layer.

20. The electronic system according to claim 15, wherein the first screen region and the second screen region each comprises a liquid crystal element.

21. The electronic system according to claim 15, wherein the photodiode is electrically connected to a photodiode reset signal line.

22. The electronic system according to claim 15, wherein power supply voltage is not supplied to the scan line driver circuit during the first period.

23. The electronic system according to claim 15,
wherein the first screen region displays a touch-input button as the still image, and
wherein the second screen region displays a moving image in response to the video signal.

* * * * *